(12) United States Patent
Kajihara (10) Patent No.: US 8,926,807 B2
(45) Date of Patent: Jan. 6, 2015

(54) VACUUM PROCESSING APPARATUS AND OPTICAL COMPONENT MANUFACTURING METHOD

(75) Inventor: Yuji Kajihara, Fuchu (JP)

(73) Assignee: Canon Anelva Corporation, Kawasaki-shi (JP)

( * ) Notice: Subject to any disclaimer, the term of this patent is extended or adjusted under 35 U.S.C. 154(b) by 232 days.

(21) Appl. No.: 13/016,053

(22) Filed: Jan. 28, 2011

(65) Prior Publication Data

US 2011/0120858 A1    May 26, 2011

Related U.S. Application Data (63) Continuation of application No. PCT/JP2010/003596, filed on May 28, 2010.

(30) Foreign Application Priority Data

Jun. 8, 2009   (JP) .................................. 2009-136859

(51) Int. Cl.
   *C23C 14/34*      (2006.01)
   *C23C 14/54*      (2006.01)
   *C23C 14/50*      (2006.01)

(52) U.S. Cl.
   CPC .................. *C23C 14/54* (2013.01); *C23C 14/50* (2013.01); *C23C 14/505* (2013.01); *H01J 2237/2007* (2013.01); *H01J 2237/3132* (2013.01)
   USPC ................................. 204/298.15; 204/298.03

(58) Field of Classification Search
   USPC .......................... 204/298.15, 118; 414/222.04
   See application file for complete search history.

(56) References Cited

U.S. PATENT DOCUMENTS

| 3,757,609 A | * | 9/1973 | Zugel | 74/826 |
| 4,512,223 A | * | 4/1985 | Puhringer | 82/124 |

(Continued)

FOREIGN PATENT DOCUMENTS

| JP | 7-258839 A | 10/1995 |
| JP | 10-121237 A | 5/1998 |

(Continued)

*Primary Examiner* — Keith Hendricks
*Assistant Examiner* — Stefanie S Wittenberg
(74) *Attorney, Agent, or Firm* — Fitzpatrick, Cella, Harper & Scinto (57) ABSTRACT

To uniformly perform processing such as deposition on a processing object such as a large, heavy substrate for optics, the large, heavy substrate for optics is accurately, reliably attached to a holder. A vacuum processing apparatus which processes a processing object in a vacuum vessel includes a susceptor which has a surface having concavity and convexity, that is opposite to its surface on which the processing object is mounted, and movably holds the processing object, a holder which has a surface having concavity and convexity which mesh with those of the susceptor, a driving mechanism which holds the holder to be movable to a first state or a second state, and a control means for moving the susceptor while the holder is held in the first state to mesh the surface, having the concavity and convexity, of the susceptor with the surface, having the concavity and convexity, of the holder and thereby connect the susceptor and the holder to each other, moving the holder, to which the susceptor is connected, to the second state and processing the processing object, and moving the holder to the first state again and moving the susceptor so that the surface, having the concavity and convexity, of the susceptor is separated from the surface, having the concavity and convexity, of the holder.

13 Claims, 6 Drawing Sheets

(56) References Cited

U.S. PATENT DOCUMENTS

| | | | |
|---|---|---|---|
| 5,589,041 A * | 12/1996 | Lantsman | 204/192.33 |
| 2002/0021959 A1* | 2/2002 | Schauer et al. | 414/744.2 |
| 2004/0216992 A1* | 11/2004 | Ando et al. | 204/192.12 |
| 2010/0006422 A1* | 1/2010 | Yokoo et al. | 204/192.12 |

FOREIGN PATENT DOCUMENTS

| | | |
|---|---|---|
| JP | 2004-269988 A | 9/2004 |
| JP | 2007-042846 A | 2/2007 |
| JP | 2007-182617 A | 7/2007 |

* cited by examiner

VACUUM PROCESSING APPARATUS AND OPTICAL COMPONENT MANUFACTURING METHOD

CROSS-REFERENCE TO RELATED APPLICATION

This application is a continuation of International Application No. PCT/JP2010/003596, filed May 28, 2010, which claims the benefit of Japanese Patent Application No. 2009-136859, filed Jun. 8, 2009. The contents of the aforementioned applications are incorporated herein by reference in their entirety.

TECHNICAL FIELD

The present invention relates to a vacuum processing apparatus and an optical component manufacturing method.

BACKGROUND ART

In recent years, with an increase in the size of semiconductor substrates and image display devices, optical components such as large lenses and mirrors are often employed in lithographic techniques for forming patterns on them. These optical components normally have surfaces which are processed or on which a variety of thin films such as coating films are formed.

A sputtering method is employed to uniformly deposit a multilayer film on a substrate for a concave/convex optical system used in, for example, an exposure machine. Setting the target area of a cathode for use in sputtering smaller than the substrate allows an improvement in use efficiency of the target and deposition which is suitable for the three-dimensional patterns of various types of substrates and is impossible when a large target is used.

To uniformly deposit a multilayer film on a substrate for a concave/convex optical system, the distance (TS distance) between the target and the substrate for optics must be kept constant. To achieve this, PTL1 discloses a technique of controlling three or more axes such as the rotation axis of the cathode and the spin axis and scan axis of the substrate.

Also, PTL2 discloses a technique of adjusting the pressure in accordance with the distance between a target and a substrate for an optical system.

CITATION LIST

Patent Literature

PTL1: Japanese Patent Laid-Open No. 2004-269988
PTL2: Japanese Patent Laid-Open No. 2007-182617

SUMMARY OF INVENTION

Technical Problem

To uniformly deposit a multilayer film on a substrate for concave/convex optics, the TS distance must be kept constant on the order of several micrometers to several tens of micrometers.

However, in the prior arts, the relative position accuracy between the target and the substrate is on the order of several hundreds of micrometers, and does not satisfy the required accuracy. Moreover, with further increases in size and weight of substrates for optics in the future, the position accuracy is expected to further deteriorate.

It is expected that in the near future, a substrate for optics that requires processing will have a larger size and the total weight of the substrate and a transport jig attached to it will become as heavy as 500 kg. At the same time, the relative position accuracy between the target and the substrate must improve by one to two orders of magnitude.

The present invention has been made in consideration of the above-mentioned problem, and realizes a technique to accurately, reliably attach a large, heavy substrate for optics to a holder in order to uniformly perform processing such as deposition on a processing object such as the large, heavy substrate for optics.

Solution to Problem

In order to solve the above-mentioned problem, the present invention provides a vacuum processing apparatus that processes a processing object in a vacuum vessel, comprising a susceptor that has a surface having projections and grooves, that is opposite to a surface thereof on which the processing object is mounted, and movably holds the processing object, a holder which has a surface having projections and grooves which mesh with the projections and grooves of the susceptor, a driving mechanism which holds the holder such that the holder can move so as to assume one of a first state and a second state, and control means for moving the susceptor while the holder is held in the first state to mesh the surface, having the projections and grooves, of the susceptor with the surface, having the projections and grooves, of the holder and thereby connect the susceptor and the holder to each other, moving the holder, to which the susceptor is connected, so as to assume the second state to process the processing object, and moving the holder so as to assume the first state again to move the susceptor so that the surface, having the projections and grooves, of the susceptor is separated from the surface, having the projections and grooves, of the holder.

In order to solve the above-mentioned problem, there is also provided an optical component manufacturing method comprising the step of processing the processing object using the vacuum processing apparatus according to the present invention.

Advantageous Effects of Invention

According to the present invention, it is possible to uniformly perform processing such as deposition on a large, heavy processing object.

Other features and advantages of the present invention will be apparent from the following descriptions taken in conjunction with the accompanying drawings, in which like reference characters designate the same or similar parts throughout the figures thereof.

BRIEF DESCRIPTION OF DRAWINGS

The accompanying drawings, which are incorporated in and constitute a part of the specification, illustrate embodiments of the invention and, together with the description, serve to explain the principles of the invention.

DESCRIPTION OF EMBODIMENTS

Figure 1A:
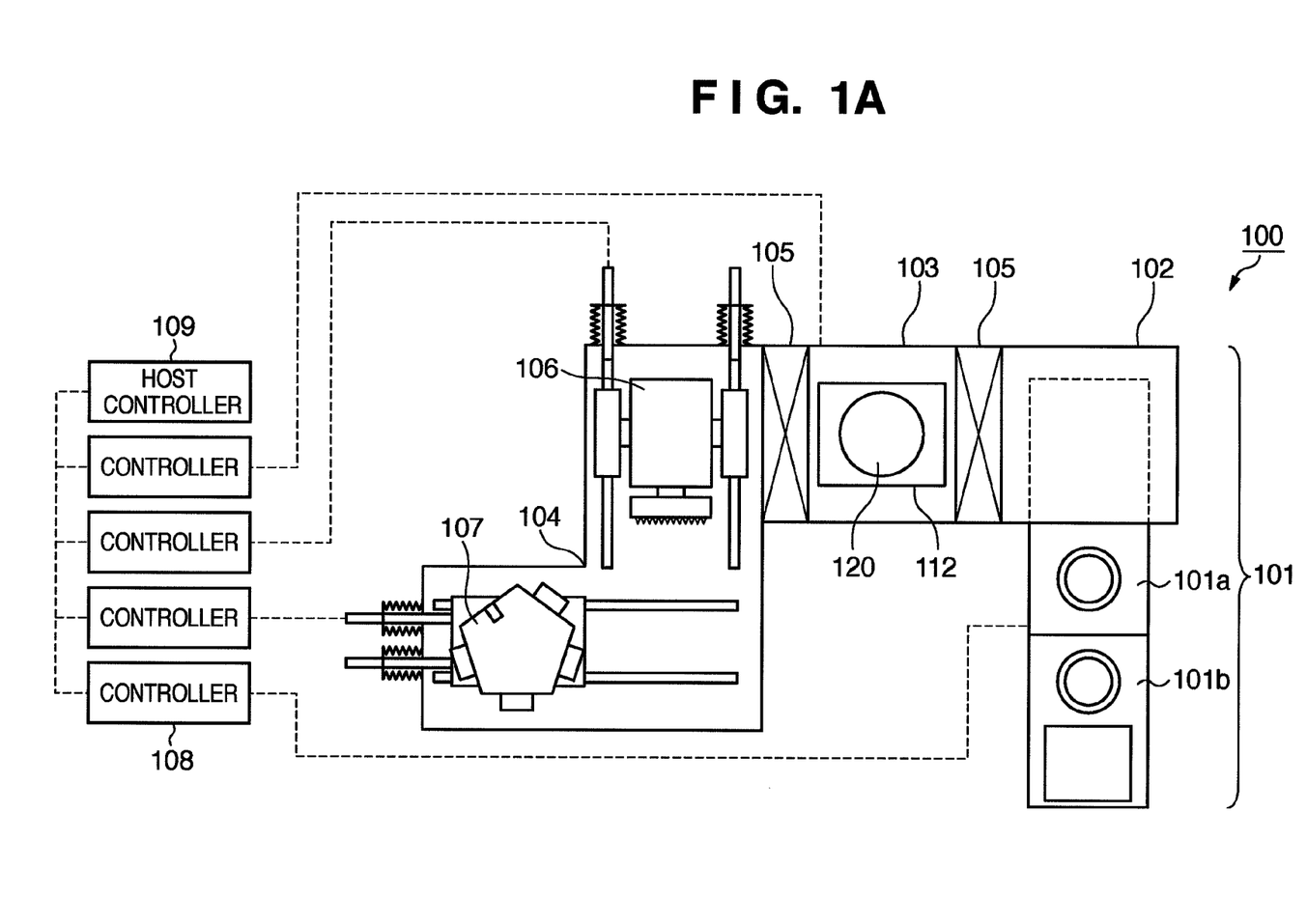
FIG. 1A is a plan view showing the schematic arrangement of a vacuum processing apparatus in an embodiment according to the present invention.

FIG. 1A is a plan view showing a vacuum processing apparatus in an embodiment according to the present invention.

Referring to FIG. 1A, reference numeral 101 denotes a balancer device; 102, an elevator chamber; 103, a load lock chamber; 104, a deposition chamber; 105, gate valves which shield the load lock chamber 103 against the atmospheric air or shield the load lock chamber 103 and the deposition chamber 104 from each other; 106, a spindle; 107, a cathode unit; 108, controllers which control the individual units; 109, a host controller which performs overall control; 112, a carriage; and 120, a processing object.

Figure 1B:
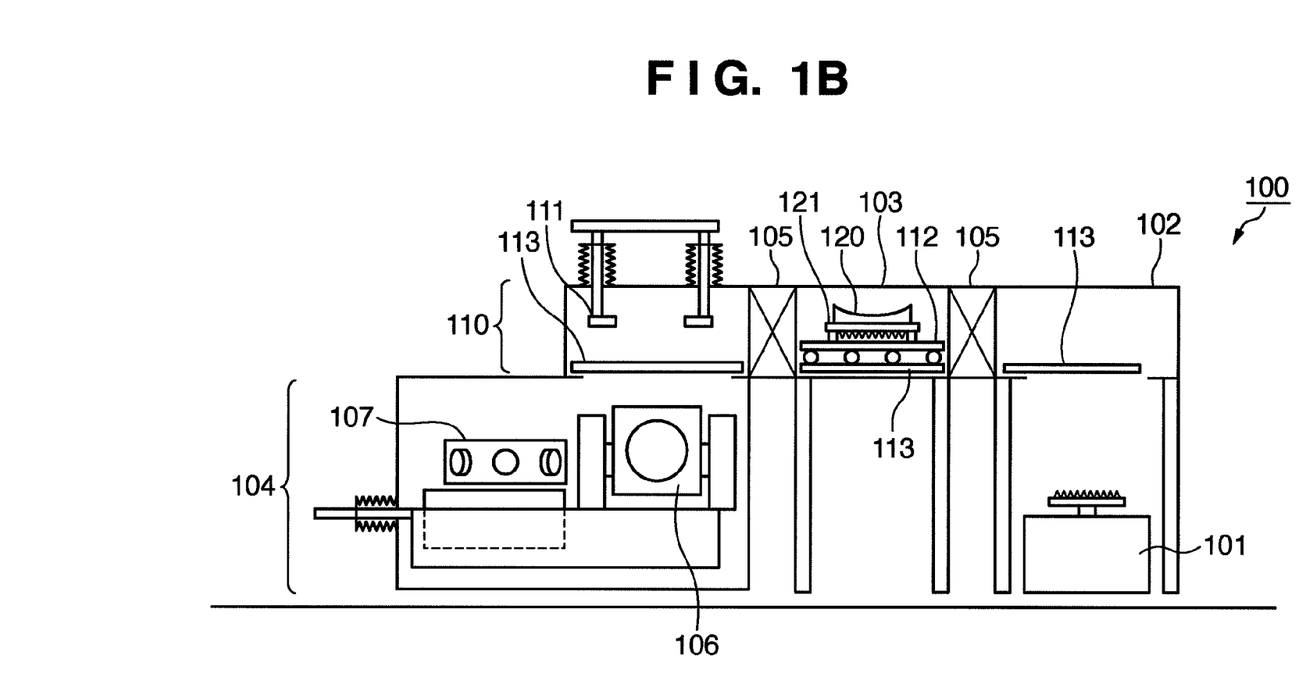
FIG. 1B is a side view showing the schematic arrangement of the vacuum processing apparatus in the embodiment according to the present invention.

FIG. 1B is a side view showing a vacuum processing apparatus 100 in the embodiment according to the present invention. The same reference numerals as in FIG. 1A denote the same constituent elements in FIG. 1B, and a description thereof will not be given. Constituent elements that have not been described with reference to FIG. 1A are a susceptor 121 on which the processing object 120 is fixed and which is used to transport the processing object 120, a transport chamber 110 disposed on the deposition chamber 104, a transfer mechanism 111 which exchanges the processing object 120 and susceptor 121 with the spindle 106 in the transport chamber 110, and a carriage transport rail 113 serving as a transport line along which the carriage 112 which mounts the processing object 120 and susceptor 121 is transported among the elevator chamber 102, the load lock chamber 103, and the transport chamber 110. In this embodiment, the load lock chamber 103, transport chamber 110, and deposition chamber 104 are evacuated to a low pressure by an exhaust means (not shown).

On a position adjusting table 101b of the balancer device 101, matching of the rotation center axes of the processing object 120 and the susceptor 121 which are integrated with each other and the position of the processing object 120 relative to the susceptor 121 are measured by, for example, a laser distance sensor, and the processing object 120 and susceptor 121 are adjusted to align themselves on the same rotation axis. The processing object 120 is made of glass when it is an optical component such as a lens or a mirror. The processing object 120 is fixed by a jig (not shown) on the susceptor 121 for transporting the processing object 120.

A dynamic balancer adjusting table 101a rotates the processing object 120 and the susceptor 121 which are integrated with each other to confirm whether their dynamic balance falls within a tolerance. If the dynamic balance falls outside the tolerance, it is corrected using, for example, a weight.

After the dynamic balance of the processing object 120 and susceptor 121 is determined to fall within the tolerance, the susceptor 121 on which the processing object 120 is fixed is delivered to the lower portion of the elevator chamber 102, is placed on an arm (not shown) provided in the elevator chamber 102, and ascends to the upper portion of the elevator chamber 102.

The position adjusting table 101b, the dynamic balancer adjusting table 101a, and the lower portion of the elevator chamber 102 will be collectively referred to as the balancer device 101 throughout the specification.

The transport rail 113 along which the carriage 112 reciprocates is set in the upper portion of the elevator chamber 102, the load lock chamber 103, and the transport chamber 110. The transport rail 113 is used to transport the carriage 112, which mounts the processing object 120 and susceptor 121, between the elevator chamber 102 and the transport chamber 110 while guiding the carriage 112 using its own guiding function.

An arm (not shown) is provided in the elevator chamber 102. When the susceptor 121 is transported into the elevator chamber 102 by the balancer device 101, the transfer portion of the arm which has been retracted is moved to a position immediately below the susceptor 121. After that, the arm ascends and receives the susceptor 121, and the susceptor 121 ascends, together with the arm. Upon the ascent, the susceptor 121 temporarily ascends up to a position higher than the carriage 112 present on the transport rail 113. The carriage 112 that has been retracted in the load lock chamber 103 moves to the elevator chamber 102 and stops at a position immediately below the susceptor 121.

The susceptor 121 on which the processing object 120 is fixed descends by means of the arm in the elevator chamber 102 up to the level at which it is mounted on the carriage 112, and the processing object 120 and susceptor 121 are transferred from the transfer portion of the arm onto the carriage 112. Note that after transferring the susceptor 121 onto the carriage 112, the arm horizontally moves and retracts from the position immediately below the susceptor 121.

Since the arm in the elevator chamber 102 blocks or hampers transportation of the carriage 112 into the load lock chamber 103, it temporarily ascends for retraction. The carriage 112, which mounts the susceptor 121 on which the processing object 120 is fixed, is transported from the elevator chamber 102 into the load lock chamber 103. The gate valve 105 is present between the elevator chamber 102 and the load lock chamber 103, and can shield the interior of the load lock chamber 103 against the atmospheric air. The controller 108 of the balancer device 101 controls the foregoing processes under the supervision of the host controller 109.

In this embodiment, the load lock chamber 103 is connected to a vacuum pump (not shown) with high mass-exhaust performance so as to be evacuated up to a sufficiently low pressure (for example, a pressure of 10E-4 Pa or less). Also, a means for heating the load lock chamber 103 is desirably provided in order to prevent water from reaching the downstream side of the gate valve 105.

When the pressure of the load lock chamber 103 sufficiently drops, the gate valve 105 between the load lock chamber 103 and the transport chamber 110 opens. The carriage 112 which mounts the susceptor 121 on which the processing object 120 is fixed moves into the transport chamber 110. When the carriage 112 enters the transport chamber 110 and reaches a position above the spindle 106 in the deposition chamber 104, it stops and then the gate valve 105 between the load lock chamber 103 and the transport chamber 110 closes. The controller 108 of the load lock chamber 103 controls the foregoing processes under the supervision of the host controller 109.

In the transport chamber 110, the susceptor 121 on which the processing object 120 is fixed is transferred from the carriage 112 to the spindle 106. The distal end portions of the transfer mechanism 111 descend to a position slightly lower than the lower surface of the susceptor 121 mounted on the carriage 112. The distal end portions of the transfer mechanism 111 rotate and thereupon enter a clearance immediately below the susceptor 121. The distal end portions of the transfer mechanism 111 ascend, so the susceptor 121 ascends up to a position higher than the carriage 112. After that, the gate valve 105 between the load lock chamber 103 and the transport chamber 110 opens, the carriage 112 retracts into the load lock chamber 103, and the gate valve 105 closes.

In accordance with almost the reverse procedure to the processes performed in the elevator chamber 102, the susceptor 121 on which the processing object 120 is fixed is transferred to and supported by the transfer mechanism 111. The susceptor 121 on which the processing object 120 is fixed descends by means of the transfer mechanism 111. When the susceptor 121 comes close to the spindle 106 at a lower position, a curvic coupling on the susceptor 121 and that mounted on a holder at the distal end of the spindle 106 start to mesh with each other, and the axis of the processing object 120 and susceptor 121 finally automatically coincides with the corresponding axis of the spindle 106.

A curvic coupling is fixed on the surface of the susceptor 121, which is opposite to the processing object 120. A curvic coupling is also fixed on the holder at the distal end of the spindle 106. These curvic couplings have sets of tapered teeth, so the sets of teeth normally finally mesh with each other in a self-aligning manner even if their positions shift from each other within the range of about ±1.5 mm. Hence, there is no need to accurately position the transfer mechanism 111 in mounting the susceptor 121 on the spindle 106.

Also, when the susceptor 121 is transported such that a predetermined position defined on it always faces a constant phase direction to allow the teeth of the curvic coupling on the susceptor 121 to always mesh with the same, corresponding teeth of the spindle 106 each time, a higher position reproducibility of the processing object 120 and susceptor 121 relative to the spindle 106 can be obtained.

Note that the curvic couplings have a pair of concave and convex teeth formed on them. It is especially preferable to coaxially annularly, radially form the pair of teeth because these two members coaxially couple together upon engaging the tooth groove which is annularly, radially formed in one surface of one member with that which is annularly, radially formed in the corresponding surface of the other member, thereby exhibiting a self-aligning function. The tops of the tooth grooves are truncated in many cases.

The processing object 120 and the susceptor 121 on which it is fixed are attracted to the spindle 106 by a chucking mechanism provided at the distal end of the spindle 106 so as to prevent the sets of teeth of the curvic couplings from disengaging from each other upon rotating the susceptor 121, on which the processing object 120 is fixed, to stand upright from a horizontal state (first state) to a vertical state (second state) (upon moving the spindle 106 from a vertical position to a horizontal position) or upon spinning the elevator chamber 102. The attraction force is weak enough not to deform the processing object 120 and strong enough not to remove the susceptor 121 from the spindle 106 during rotation.

The cathode unit 107 controlled by the host controller 109 and the controller 108 of the cathode unit 107 uniformly performs deposition processing on the processing object 120 which assumes a vertical state.

After the processing is completed, the processing object 120 and the susceptor 121 on which the processing object 120 is fixed can be recovered by performing the above-mentioned operations in reverse order in principle. That is, the spindle 106 is rotated from a horizontal position to a vertical position to move the susceptor 121, on which the processing object 120 is fixed, from a vertical state to a horizontal state, and the susceptor 121 on which the processing object 120 is fixed is lifted by the transfer mechanism 111 to separate it from the spindle 106 meshing with it via the curvic couplings. The controllers 108 of the transport chamber 110 and spindle 106 control the foregoing processes under the supervision of the host controller 109.

Figure 2A:
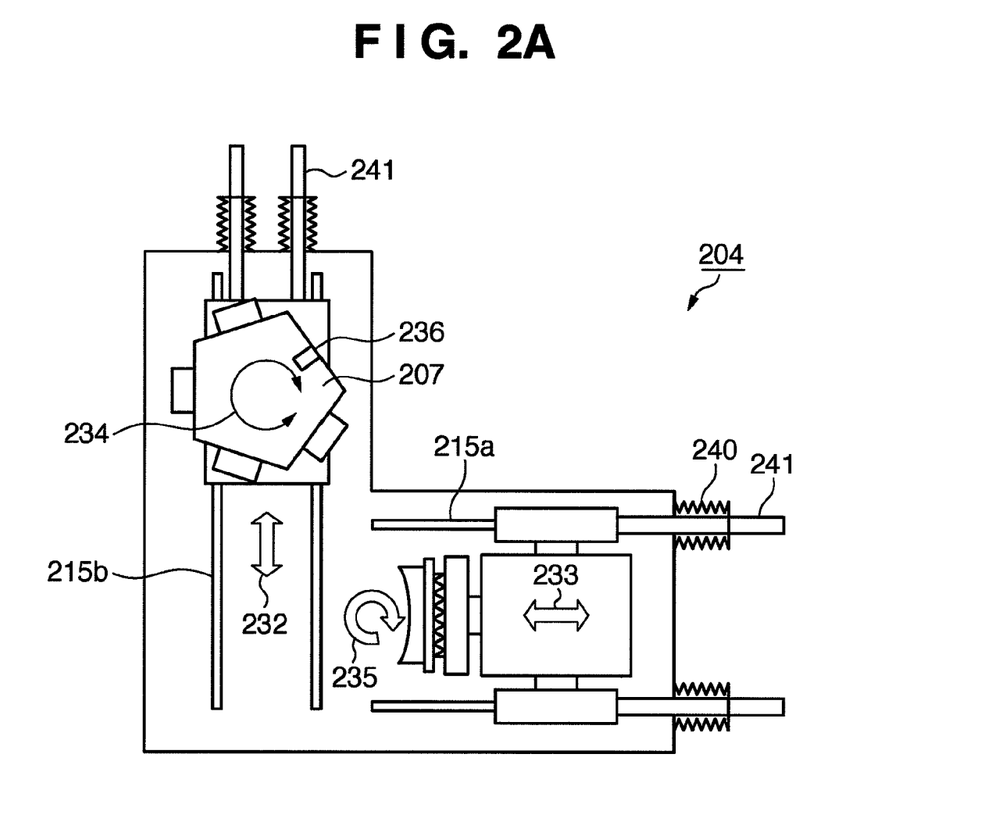
FIG. 2A is a plan view showing the schematic arrangement of a deposition chamber of the vacuum processing apparatus in the embodiment according to the present invention.
Figure 2B:
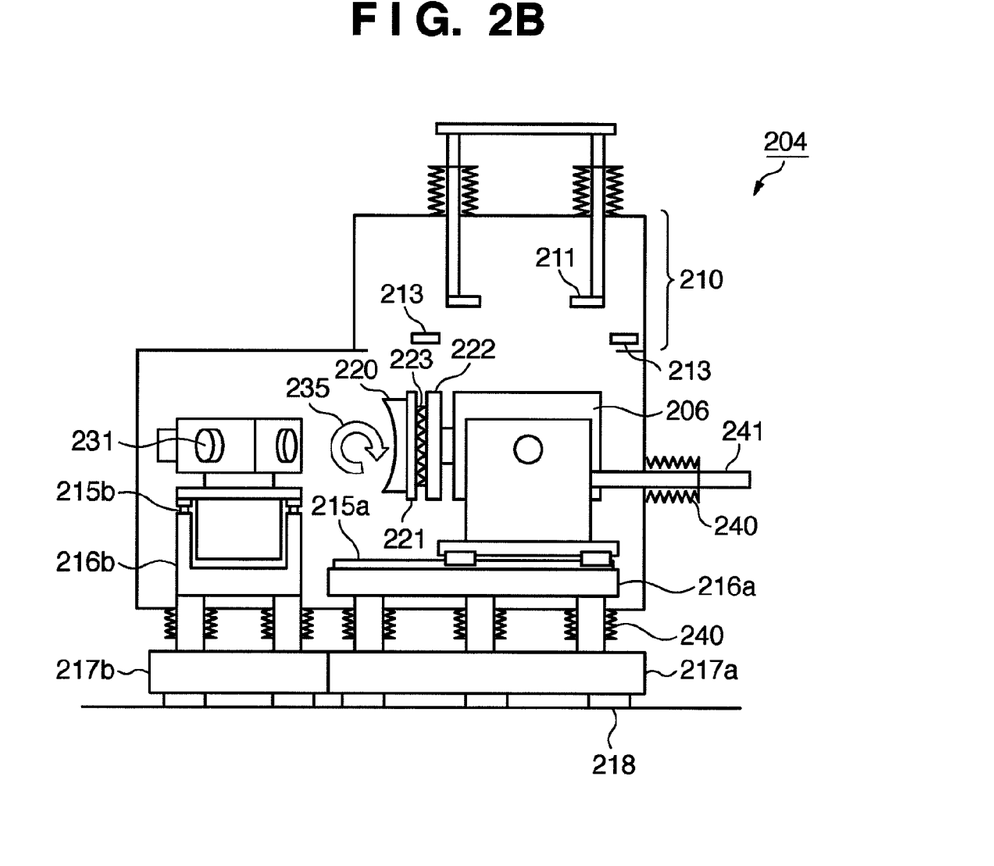
FIG. 2B is a side view showing the schematic arrangement of the deposition chamber of the vacuum processing apparatus in the embodiment according to the present invention.
Figure 2C:
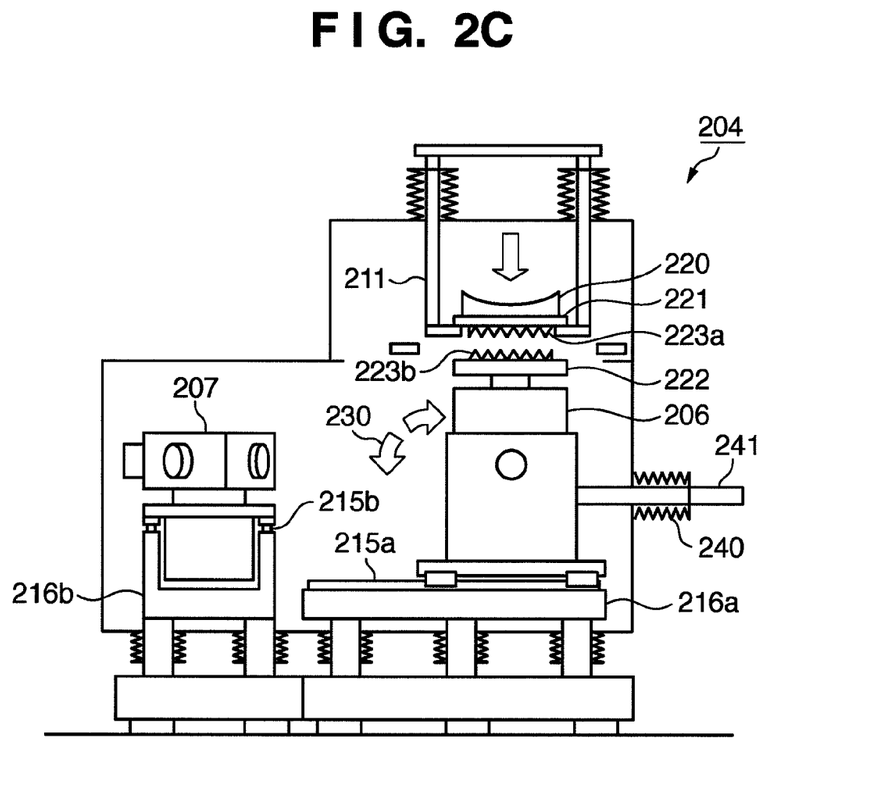
FIG. 2C is a side view showing the schematic arrangement of the deposition chamber of the vacuum processing apparatus in the embodiment according to the present invention.

FIGS. 2A to 2C are views showing the schematic arrangement of the deposition chamber 104 shown in FIGS. 1A and 1B. A deposition chamber 204 will be described with reference to FIGS. 2A to 2C. FIG. 2A is a plan view of the deposition chamber 204, FIG. 2B is a sectional side view depicting the state in which a susceptor 221 on which a processing object 220 is fixed faces a cathode unit 207, and FIG. 2C is a side view depicting the state in which a spindle 206 rotates to a vertical position and the susceptor 221 on which the processing object 220 is fixed is separated from a holder 222 by a transfer mechanism 211.

Reference numerals with the same last two digits as in FIGS. 1A and 1B denote substantially the same constituent elements in FIGS. 2A to 2C, and a description thereof will not be given. Reference numerals 215a and 215b denote linear guide rails; 216a and 216b, vacuum-side bases; 217a and 217b, atmospheric-side bases; 218, a height adjusting block; 222, the holder; 223, a curvic coupling; 220, the processing object; 221, the susceptor; 231, a target; 236, a measuring device; 240, bellows; and 241, a wire/pipe extension tube used to extend a pipe for supplying isothermal water with a constant temperature and a wire for, for example, a driving motor. Reference numeral 233 denotes the movement direction of the spindle 206; 234, the oscillation direction of the cathode unit 207; and 235, the rotation direction of the holder 222.

In this embodiment, the cathode unit 207 has a nearly regular pentagon shape, and the target 231 is attached to it such that the center of the target 231 coincides with that of each side of the cathode unit 207. Also, the measuring device 236 is attached to one side of the cathode unit 207. Note that the cathode unit 207 rotates by oscillation in the oscillation direction 234 about its central axis.

The spindle 206 and cathode unit 207 are mounted on the linear guide rails 215a and 215b, which are supported by the vacuum-side bases 216a and 216b and atmospheric-side bases 217a and 217b, respectively.

With the foregoing structure, the cathode unit 207 and spindle 206 can move in linear directions 232 and 233 along the linear guide rails 215a and 215b. Because the spindle 206 and cathode unit 207 are mounted on the vacuum-side bases 216a and 216b and atmospheric-side bases 217a and 217b, respectively, their mounting surfaces themselves do not deform. Moreover, because minute holes (not shown) are formed in the vacuum-side bases 216a and 216b, and isothermal wafer always flows through these holes, thermal expansion with a change in temperature, for example, does not occur in the vacuum-side bases 216a and 216b and therefore does not influence moving portions on the vacuum-side bases 216a and 216b, such as the cathode unit 207, thus obtaining high position reproducibility.

The holder 222 is attached to the distal end of the spindle 206. One tooth groove of the curvic coupling 223 is formed in one surface of the holder 222.

As has been described with reference to FIGS. 1A and 1B, the susceptor 221 on which the processing object 220 having been transported to a position immediately above the spindle 206 by the carriage 112 is fixed is connected to the holder 222 at the distal end of the spindle 206 while the tooth groove of a curvic coupling 223a on the susceptor 221 meshes with that of a curvic coupling 223b on the spindle 206.

After the susceptor 221 on which the processing object 220 is fixed is connected to the holder 222, the susceptor 221 on which the processing object 220 is fixed is attracted and fixed onto the holder 222 by a chucking mechanism (to be described later). After that, the spindle 206 rotates in a direction 230 in which it falls from a vertical position to a horizontal position by means of a rotating mechanism (not shown) to move the holder 222 from a horizontal state to a vertical state (a state shown in FIG. 2B).

On the other hand, the cathode unit 207 to which the target 231 is attached moves along the linear guide rail 215b up to the position at which it squarely faces the spindle 206. Finally, the processing object 220 squarely faces the target 231 attached to the cathode unit 207. Also, the susceptor 221 on which the processing object 220 connected to the holder 222 is fixed can be rotated in a rotation direction 235 about its spin axis by a motor built into the spindle 206.

The reason why the processing object 220 and susceptor 221 are attached to the holder 222 in a horizontal state and are then rotated to stand upright in the foregoing way will be explained below.

As has been described first, the weight of the processing object 220 increases with an increase in its size. The total weight of the processing object 220 and the susceptor 221 sometimes exceeds 500 kg.

In this embodiment, the curvic couplings 223 are used for normal position detection and fixing. As described earlier, when the pair of curvic couplings 223 face each other in a horizontal state, normal position detection can be precisely performed in a self-aligning manner by bringing the tapered surfaces of the curvic couplings 223 into contact with each other.

On the other hand, when the susceptor 221 is held while the holder 222 stands upright, that is, it is set vertically (a state shown in FIG. 2B), the self weights of the processing object 220 and susceptor 221 vertically act on the curvic couplings 223. In other words, the self weights of the processing object 220 and susceptor 221 act on the tapered surfaces of the curvic couplings 223 vertically, that is, in the direction going into the tooth grooves, so the tapered surfaces of the curvic couplings 223 suffer end tooth bearing and the curvic couplings 223 do not smoothly perfectly mesh with each other. As the weighs of the processing object 220 and susceptor 221 get heavier, it becomes harder for the sets of teeth of the curvic couplings 223 to mesh with each other. Furthermore, as the coefficient of friction increases in a lower-pressure environment (for example, 1,000 Pa or less), it is often the case that the sets of teeth of the curvic couplings 223 do not smoothly mesh with each other. As a result, precise normal position detection becomes more difficult.

Also, when the curvic couplings 223 are finally made to perfectly mesh with each other by applying a force, with which the susceptor 221 is attracted to the holder 222, to the susceptor 221 by the chucking mechanism, end tooth bearing as described above hinders the susceptor 221 from being sufficiently attracted to the holder 222.

On the other hand, from the viewpoint of reducing the adverse effect of particles, the processing object 220 desirably assumes a vertical state. This is to avoid the adverse effect of adhesion of particles that fall gravitationally.

The inventor of the present invention took the foregoing fact into consideration, and concluded that when the susceptor 221 is attached to the holder 222 and undergoes normal position detection, both in a horizontal state using the curvic couplings 223, and is then rotated to assume a vertical state, it is possible to precisely, reliably perform normal position detection and fixing without causing end tooth bearing of the curvic couplings 223, and to achieve processing that is less subject to particles. Note that when the meshing surfaces of the curvic couplings 223 are coated with lithium-based grease which discharges little gas (for example, Space Lub® ML No. 2 available from Kyodo Yushi Co., Ltd.), they more smoothly mesh with each other, thus improving the reliability.

The chucking mechanism which attracts and fixes, onto the holder 222, the susceptor 221 on which the processing object 220 is fixed will be described next with reference to FIG. 3.

Figure 3:
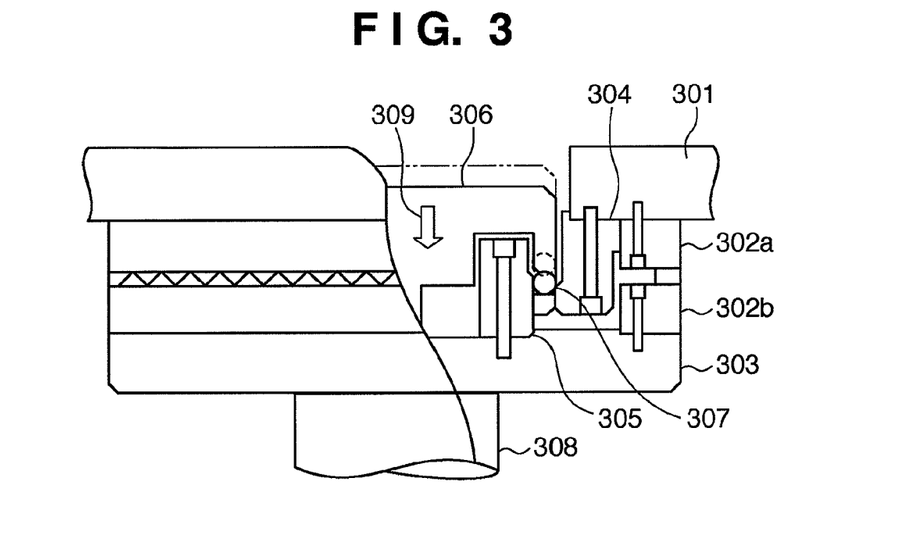
FIG. 3 is a view showing the schematic arrangement of a chucking mechanism of the vacuum processing apparatus in the embodiment according to the present invention.

Referring to FIG. 3, reference numeral 301 denotes a susceptor; 302a and 302b, curvic couplings each having one surface in which a tooth groove is formed; 303, a holder; 304, a susceptor-side block; 305, a holder-side block; 306, an opening shaft; 307, a ball; and 308, a spindle shaft. Although not shown in FIG. 3, a processing object is fixed on the surface of the susceptor 301, which is opposite to that to which the curvic coupling 302a is attached.

The opening shaft 306 at the center of a spindle shaft 308 operates in a closing direction 309 by means of the force of a spring (not shown) inside the spindle shaft 308. Note that the opening shaft 306 operates in the direction opposite to the closing direction 309 by means of a cylinder mechanism having a thrust larger than the spring force. Note also that the cylinder mechanism is disposed at the distal end of the spindle shaft 308, and is not shown in FIG. 3.

When the opening shaft 306 operates in the closing direction 309 by means of the spring force, balls 307 arranged at several points in the circumferential direction of the opening shaft 306 are pressed against the opening shaft 306 and holder-side block 305 and thereupon launch toward the susceptor-side block 304. The launched balls 307 are pushed in the closing direction 309 by the opening shaft 306 and thereupon push the susceptor-side block 304 in the closing direction 309. That is, the balls 307 push the projecting portion of the susceptor-side block 304 in the closing direction 309, and the susceptor 301 is attracted to the holder 303 as a result. Thus, the susceptor 301 is attracted to and held by the holder 303.

At the same time, the curvic couplings 302a and 302b mesh with each other to position the rotation center of the spindle shaft 308 and the center of the susceptor 301 by the self-aligning function of the curvic couplings 302a and 302b.

The force with which the opening shaft 306 operates in the closing direction 309, that is, the spring force is desirably about 1.7 ton, which is weak enough not to deform the susceptor 301 and strong enough to maintain the susceptor 301 in a vertical state and not to remove it from the holder 303 during rotation. The spring force with this magnitude also acts as the meshing force with which the curvic couplings 302a and 302b can exhibit their self-aligning function.

As a method of separating the susceptor 301 from the holder 303, the above-mentioned operations need only be performed in reverse order in principle. That is, the opening shaft 306 operates in the direction opposite to the closing direction 309 by means of the cylinder mechanism, the susceptor-side block 304 is released from restriction of the balls 307, and the susceptor 301 is separated from the holder 303 by the transfer mechanism 211.

An arrangement, which keeps the distance between a target and the surface of a processing object constant, will be described next with reference to FIG. 4.

Figure 4:
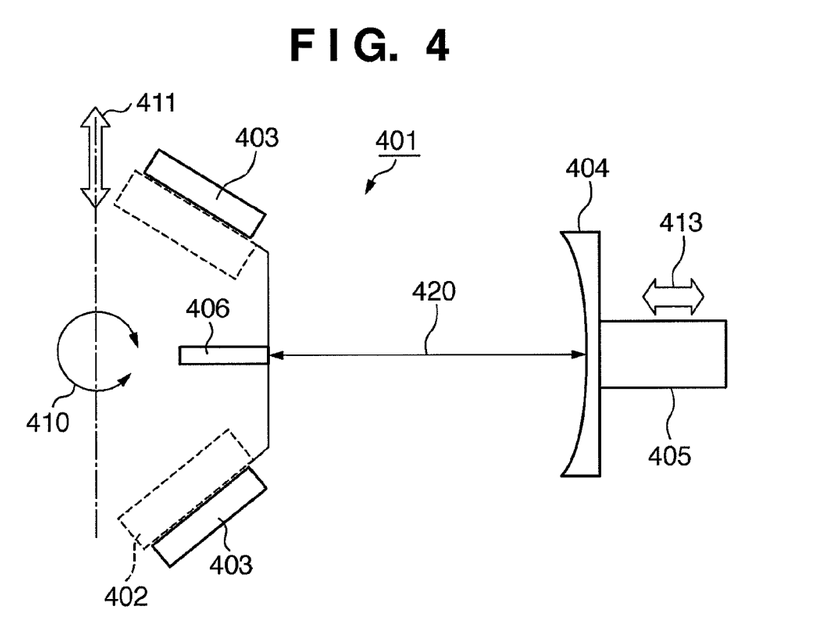
FIG. 4 is a view for explaining adjustment of the distance between a target and a processing object in the embodiment according to the present invention.

Referring to FIG. 4, reference numeral 401 denotes a cathode unit; 402, a cathode; 403, a target; 404, a processing object; and 405, a spindle. Although the processing object 404 is attached to a susceptor by a jig (not shown) and the susceptor is connected to a holder attached to the distal end of the spindle 405 in practice, the susceptor and the holder are not shown in FIG. 4 for the sake of descriptive convenience.

The cathode unit 401 is mounted on the linear guide rail 215b and can move in a linear direction 411, rotate about its central axis, and perform oscillating rotation 410, as has been described with reference to FIGS. 2A to 2C. On the other hand, the spindle 405 is mounted on the guide rail and can move in a linear direction 413.

The cathode 402 is attached to each side of the cathode unit 401, which has a regular pentagon shape and to which a plurality of cathodes 402 can be attached, to make it possible to form a multilayer film. The target 403 is attached to the surface of the cathode 402. A magnet (not shown) which produces an asymmetric magnetic field spins about the central axis of the target 403 inside the cathode 402, thereby uniformly sputtering the target 403.

A method in which the distance between the processing object 404 and the surface of the target 403 is set with the above-mentioned arrangement to a predetermined value as a condition indispensable to uniformly performing deposition on the processing object 404 will be described.

A measuring device 406 which measures the distance is buried in one surface of the cathode unit 401. The measuring device 406 includes a built-in laser emitting device and can measure the distance between the processing object 404 and one surface of the cathode unit 401 by detecting, using the light-receiving portion of the measuring device 405, laser light which is emitted by the laser emitting device and reflected by the surface of the processing object 404.

When the size of the target 403 is measured in advance, the distance between an arbitrary target 403 and the processing object 404 can be determined based on the measurement value obtained by the measuring device 406. Hence, the distance between the target 403 and the processing object 404 can be set to a predetermined value 420 by moving the spindle 405 in the linear direction 413 based on the determined value of the distance.

Although an embodiment according to the present invention has been described above, the present invention is not particularly limited to this embodiment. Also, although a concave optical component has been exemplified as the processing object, the present invention is also applicable to convex and planar optical components.

Further, although sputter deposition processing has been exemplified in this embodiment, the present invention is also applicable to a vacuum processing apparatus which performs, for example, preprocessing, post-processing, or etching processing using an ion source or radical source which is compact relative to a processing object.

The present invention is not limited to the above-described embodiments, and various changes and modifications can be made within the spirit and scope of the present invention. Therefore, to apprise the public of the scope of the present invention, the following claims are made.

The invention claimed is:

1. A vacuum processing apparatus which processes a processing object having a large size and heavy weight in a vacuum vessel comprising:

a susceptor which has a surface having concavity and convexity, that is opposite to a surface thereof on which the processing object is mounted, and holds the processing object;

a holder which has a surface having concavity and convexity which can mesh with the concavity and convexity of said susceptor;

a driving mechanism which holds said holder so as to be movable to a horizontal state or a vertical state;

a controller which controls mutual movements of said susceptor and holder to (i) move said susceptor, on which the processing object is fixed, downward by weight of the processing object and susceptor while said holder is held in the horizontal state to mesh with the surface having the concavity and convexity of said susceptor with the surface having the concavity and convexity of said holder and engage said susceptor and said holder, and (ii) subsequently to move said holder, to which said susceptor is connected, to the vertical state and process the processing object, and (iii) move said holder to the horizontal state again and move said susceptor so that the surface having the concavity and convexity of said susceptor is separated from the surface having the concavity and convexity of said holder;

a balancer device;

an elevator chamber disposed on an upper side of the balancer device;

a load lock chamber connected to the elevator chamber via a gate valve;

a deposition chamber connected to the load lock chamber via another gate valve, wherein the gate valves shield the load lock chamber against the atmospheric air or shield the load lock chamber and the deposition chamber from each other; and a transport chamber disposed on the deposition chamber, wherein the susceptor is configured so that it can move to connect to the holder held in the horizontal state and can be lifted to separate the susceptor from the holder, wherein the concavities and convexities of said susceptor and holder are tapered so that the concavities and convexities of said susceptor and holder mesh with each other in a state that said holder is held in the horizontal state, wherein the balancer device has a position adjusting table which adjusts rotation center axes of the processing object and the susceptor which are integrated with each other so as to align the processing object and the susceptor on the same rotation axis, and a dynamic balancer adjusting table which rotates the processing object and the susceptor which are integrated with each other to confirm whether their dynamic balance falls within a tolerance, wherein a transport rail along which a carriage is transported among the Zone elevator chamber, the load lock chamber, and the transport chamber, is arranged at an upper portion of the elevator chamber, the load lock chamber, and the transport chamber, and wherein the transport rail transports the carriage which mounts the processing object and the susceptor, between the elevator chamber and the transport chamber while guiding the carriage.

2. The vacuum processing apparatus according to claim 1, wherein the surfaces having the concavity and convexity of said susceptor and said holder form a toothed coupling mechanism.

3. The vacuum processing apparatus according to claim 1, wherein the vacuum vessel includes a temperature controller, which maintains the vacuum vessel at a constant temperature.

4. The vacuum processing apparatus according to claim 1, wherein the vacuum processing apparatus is an apparatus performing sputtering processing on the processing object.

5. The vacuum processing apparatus according to claim 1, further comprising:
   a transfer mechanism which is provided at a position where said transfer mechanism faces said holder having moved to the horizontal state and is configured to transfer said susceptor to said holder; and
   a cathode unit which is provided at a position where said cathode unit faces said holder having moved to the vertical state and is configured to hold a target.

6. The vacuum processing apparatus according to claim 5, wherein said cathode unit is formed in a regular polygon shape so that a plurality of cathodes can be attached thereto and is configured to be capable of rotating about a central axis thereof, and said cathode unit is configured to be linearly movable along a guide rail.

7. The vacuum processing apparatus according to claim 6, further comprising a measuring device which is provided on one surface of said cathode unit with the regular polygon shape and is configured to measure a distance between the target and the processing object.

8. The vacuum processing apparatus according to claim 1, further comprising a chucking mechanism which attracts and fixes, onto the holder, the susceptor on which the processing object is fixed.

9. The vacuum processing apparatus according to claim 8, wherein said driving mechanism has a spindle shaft, an opening shaft arranged at the center of the spindle shaft, a spring arranged in the spindle shaft and a cylinder mechanism having a thrust larger than a spring force, and
   wherein the opening shaft operates in a direction opposite to a closing direction by the cylinder mechanism and operates in the closing direction by the spring force.

10. A vacuum processing apparatus which processes a processing object having a large size and heavy weight in a vacuum vessel comprising:
   a susceptor which has a surface having concavity and convexity, that is opposite to a surface thereof on which the processing object is mounted, and holds the processing object;
   a holder which has a surface having concavity and convexity which can mesh with the concavity and convexity of said susceptor;
   a driving mechanism which holds said holder so as to be movable to a horizontal state or a vertical state;
   a controller which moves said susceptor while said holder is held in the horizontal state to mesh the surface having the concavity and convexity of said susceptor with the surface having the concavity and convexity of said holder and thereby connect said susceptor and said holder to each other, moves said holder, to which said susceptor is connected, to the vertical state and processes the processing object, and moves said holder to the horizontal state again and moves said susceptor so that the surface having the concavity and convexity of said susceptor is separated from the surface having the concavity and convexity of said holder,
   wherein the concavities and convexities of said susceptor and holder are tapered so that the concavities and convexities of said susceptor and holder mesh with each other in a state that said holder is held in the horizontal state;
   a balancer device;
   an elevator chamber disposed on an upper side of the balancer device;
   a load lock chamber connected to the elevator chamber via a gate valve;
   a deposition chamber connected to the load lock chamber via a gate valve,
   wherein the gate valves shield the load lock chamber against the atmospheric air or shield the load lock chamber and the deposition chamber from each other; and
   a transport chamber disposed on the deposition chamber,
   wherein the balancer device has a position adjusting table which adjusts rotation center axes of the processing object and the susceptor which are integrated with each other so as to align the processing object and the susceptor on the same rotation axis and a dynamic balancer adjusting table which rotates the processing object and the susceptor which are integrated with each other to confirm whether their dynamic balance falls within a tolerance,
   wherein a transport rail along which a carriage is transported among the elevator chamber, the load lock chamber, and the transport chamber, is arranged at an upper portion of the elevator chamber, the load lock chamber and the transport chamber, and
   wherein the transport rail transports the carriage, which mounts the processing object and the susceptor, between the elevator chamber and the transport chamber while guiding the carriage.

11. A vacuum processing apparatus which processes a processing object having a large size and heavy weight in a vacuum vessel comprising:
   a susceptor which has a surface having concavity and convexity, that is opposite to a surface thereof on which the processing object is mounted, and holds the processing object;
   a holder which has a surface having concavity and convexity which can mesh with the concavity and convexity of said susceptor;
   a driving mechanism which holds said holder so as to be movable to a horizontal state or a vertical state;
   a controller which controls mutual movements of said susceptor and holder to (i) move said susceptor, on which the processing object is fixed, downward by weight of the processing object and susceptor while said holder is held in the horizontal state to mesh with the surface having the concavity and convexity of said susceptor with the surface having the concavity and convexity of said holder and engage said susceptor and said holder, and (ii) subsequently to move said holder, to which said susceptor is connected, to the vertical state and process the processing object, and (iii) move said holder to the horizontal state again and move said susceptor so that the surface having the concavity and convexity of said susceptor is separated from the surface having the concavity and convexity of said holder, and
   a balancer device,
   wherein the susceptor is configured so that it can move to connect to the holder held in the horizontal state and can be lifted to separate the susceptor from the holder,
   wherein the concavities and convexities of said susceptor and holder are tapered so that the concavities and convexities of said susceptor and holder mesh with each other in a state that said holder is held in the horizontal state, and
   wherein the balancer device includes a dynamic balancer adjusting table which corrects the dynamic balance of the processing object and the susceptor by using a weight if the dynamic balance of the processing object and the susceptor falls outside a tolerance.

12. The vacuum processing apparatus according to claim 11, wherein the processing object and the susceptor are transported to the deposition chamber after the dynamic balance of the processing object and the susceptor is corrected to fall within the tolerance.

13. A vacuum processing apparatus which processes a processing object having a large size and heavy weight in a vacuum vessel comprising:
   a susceptor which has a surface having concavity and convexity, that is opposite to a surface thereof on which the processing object is mounted, and holds the processing object;
   a holder which has a surface having concavity and convexity which can mesh with the concavity and convexity of said susceptor;
   a driving mechanism which holds said holder so as to be movable to a horizontal state or a vertical state;
   a controller which controls mutual movements of said susceptor and holder to (i) move said susceptor, on which the processing object is fixed, downward by weight of the processing object and susceptor while said holder is held in the horizontal state to mesh with the surface having the concavity and convexity of said susceptor with the surface having the concavity and convexity of said holder and engage said susceptor and said holder, and (ii) subsequently to move said holder, to which said susceptor is connected, to the vertical state and process the processing object, and (iii) move said holder to the horizontal state again and move said susceptor so that the surface having the concavity and convexity of said susceptor is separated from the surface having the concavity and convexity of said holder;and
   a balancer device having a position adjusting table which adjusts rotation center axes of the processing object and the susceptor which are integrated with each other so as to align the processing object and the susceptor on the same rotation axis, and a dynamic balancer adjusting table which rotates the processing object and the susceptor which are integrated with each other to confirm whether their dynamic balance falls within a tolerance,
   wherein the susceptor is configured so that it can move to connect to the holder held in the horizontal state and can be lifted to separate the susceptor from the holder, and
   wherein the concavities and convexities of said susceptor and holder are tapered so that the concavities and convexities of said susceptor and holder mesh with each other in a state that said holder is held in the horizontal state.

* * * * *